United States Patent
Liu (12) United States Patent (10) Patent No.: US 7,863,141 B2
Liu (45) Date of Patent: Jan. 4, 2011

(54) INTEGRATION FOR BURIED EPITAXIAL STRESSOR

(75) Inventor: Jin Ping Liu, Beacon, NY (US)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 479 days.

(21) Appl. No.: 11/492,649

(22) Filed: Jul. 25, 2006

(65) Prior Publication Data

US 2008/0026540 A1 Jan. 31, 2008

(51) Int. Cl.
*H01L 21/336* (2006.01)

(52) U.S. Cl. .................. 438/285; 438/149; 438/424

(58) Field of Classification Search .............. 438/424, 438/149, 285, 400; 257/E21.54
See application file for complete search history.

(56) References Cited

U.S. PATENT DOCUMENTS

| | | | |
|---|---|---|---|
| 5,227,658 A | 7/1993 | Beyer | |
| 5,232,866 A | 8/1993 | Beyer | |
| 6,251,751 B1 | 6/2001 | Chu | |
| 6,429,091 B1 | 8/2002 | Chen | |
| 6,936,522 B2 | 8/2005 | Steegen | |
| 2005/0023616 A1 | 2/2005 | Forbes | |
| 2005/0035369 A1 | 2/2005 | Lin | |
| 2005/0045947 A1 | 3/2005 | Chen | |
| 2005/0106790 A1 | 5/2005 | Cheng | |
| 2005/0142700 A1 | 6/2005 | Cheng | |
| 2005/0189589 A1* | 9/2005 | Zhu et al. | 257/347 |

\* cited by examiner

*Primary Examiner*—Bradley K Smith
(74) *Attorney, Agent, or Firm*—Horizon IP Pte Ltd (57) ABSTRACT

Structures and methods of fabricating isolation regions for a semiconductor device. An example method comprises the following. We form one or more buried doped regions in a substrate. We form a stressor layer over the substrate. We form a strained layer over the stressor layer. We form STI trenches down through the strained layer and the stressor layer to as least partially expose the buried doped regions. We etch the buried doped regions to form at least a buried cavity in communication with the STI trenches. In the first and second embodiments, we fill only the STI trenches with insulation material to form isolation regions and form voids in the cavities. In the third and fourth embodiments, we fill both the STI trenches and the cavities with insulation material.

21 Claims, 8 Drawing Sheets

INTEGRATION FOR BURIED EPITAXIAL STRESSOR

BACKGROUND OF INVENTION

1) Field of the Invention

This invention relates generally to fabrication of semiconductor devices and more particularly to the fabrication of isolation regions and stress regions in a semiconductor structure.

2) Description of the Prior Art

Various techniques have emerged to improve performance of state of the art semiconductors. One technique involves introducing strain. Strained silicon exhibits improved semiconductor performance due to enhanced transport properties. Biaxial distortion of the crystal lattice in strained silicon improves electron and hole mobility.

Another performance enhancement technique involves providing a semiconductor layer separated from the substrate by an insulating layer. Also known as silicon-on-insulator (SOI), such structures exhibit reduced parasitic capacitance, thereby enabling a semiconductor to function at significantly higher speeds with reduced electrical losses. The result is an appreciable increase in performance and a reduction in power consumption.

However, further improvements in device performance are needed to newer technologies.

The importance of improving technology noted above is evidenced by the extensive technological development directed to the subject, as documented by the relevant patent and technical literature. The more relevant technical developments in the patent literature can be gleaned by considering the following.

US20050106790A1: Strained silicon on a SiGe on SOI substrate—Inventor: Cheng, Kangguo;

US20050035369A1: Structure and method of forming integrated circuits utilizing strained channel transistors—Inventor: Lin, Chun-Chieh; Hsin-Chu US20050142700A1: Strained silicon on a SiGe on SOI substrate—Inventor: Cheng, Kangguo;

US20050023616A1: Localized strained semiconductor on insulator—Inventor: Forbes, Leonard;

U.S. Pat. No. 6,251,751: Bulk and strained silicon on insulator using local selective oxidation—Inventor: Chu, Jack Oon;

U.S. Pat. No. 5,232,866: Isolated films using an air dielectric—Inventor: Beyer, Klaus D.

SUMMARY OF THE INVENTION

The embodiments of the present invention provides a structure and a method of manufacturing a semiconductor device with an isolation region which is characterized as follows.

First and second example embodiments can comprise a method of fabricating a semiconductor device comprising the steps of:
  forming one or more buried doped regions in a substrate;
  forming a stressor layer over the substrate;
  forming a strained layer over the stressor layer;
  forming STI trenches down through the strained layer and the stressor layer to as least partially expose the buried doped regions;
  etching the buried doped regions to form at least a cavity in communication with the STI trenches;
  filling the STI trenches with insulation material to form isolation regions and forming a void in the cavity.

Third and fourth example embodiments can comprise a method of fabricating a semiconductor device comprising the steps of:
  forming one or more buried doped regions in a substrate;
  forming at least a buried doped region in the substrate;
  forming a stressor layer over the substrate;
  forming a strained layer over the stressor layer;
  forming STI trenches down through the strained layer and the stressor layer to as least partially expose the buried doped regions; and etching the buried doped regions to form cavities in communication with the STI trenches;
  filling the STI trenches and the cavities with insulation material to form isolations regions and buried isolation regions.

Device example embodiments can comprise a semiconductor device comprised of:
  a stressor layer over a substrate;
  a strained layer over the stressor layer;
  a cavity in the substrate under the stressor layer;
  a transistor over the strained layer;
  STI trenches down through the strained layer and the stressor layer and communicating at least with the cavity;
  isolation regions filling the STI trenches.

A further aspect further comprises: the transistor has source and drain regions in the strained layer; and the transistor has a gate over the strained layer; the cavity is at least partially under the gate.

A further aspect further comprises: at least two cavities in the substrate under the stressor layer;
  the transistor has source and drain regions in the strained layer; and the transistor has a gate over the strained layer;
  the cavities are at least partially under the source and drain regions.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 7A-1 and 7A-2 are three dimensional views showing first and second example embodiments having voids.

FIGS. 7B-1 and 7B-2 show third and fourth example embodiments where the cavities are filled with an insulation material.

DETAILED DESCRIPTION OF THE EXAMPLE EMBODIMENTS

The example embodiments of the present invention will be described in detail with reference to the accompanying drawings. Some of the example embodiments provide structures and methods of forming buried isolation regions and voids under a stressor layer and strained layer.

Four Example Device Embodiments

Four example embodiments are shown in FIGS. 7A-1, 7A-2, 7B-1 and 7B-2.

Figure 7A:
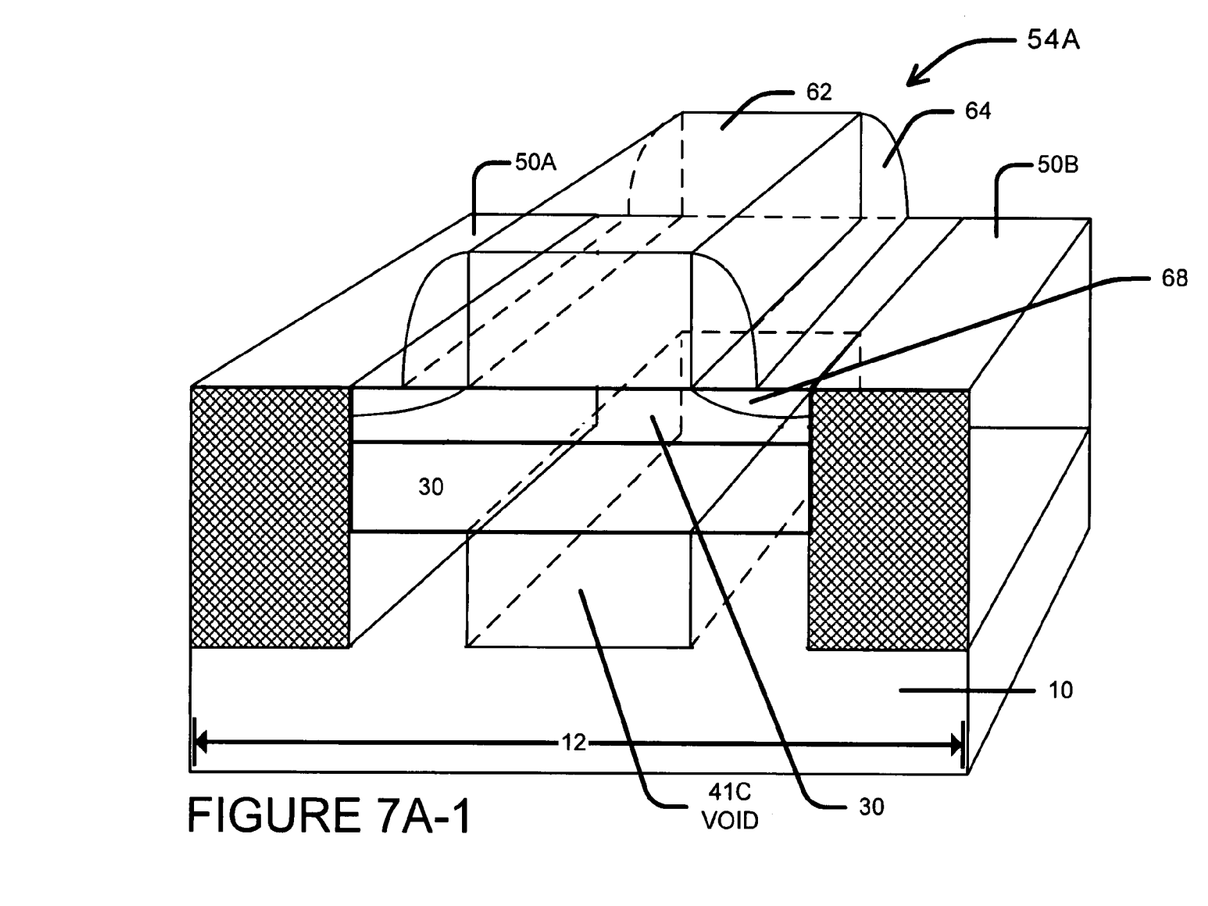

In a first example embodiment shown in FIG. 7A-1, voids 41C are formed under the channel of a FET 54A.

Figure 7A:
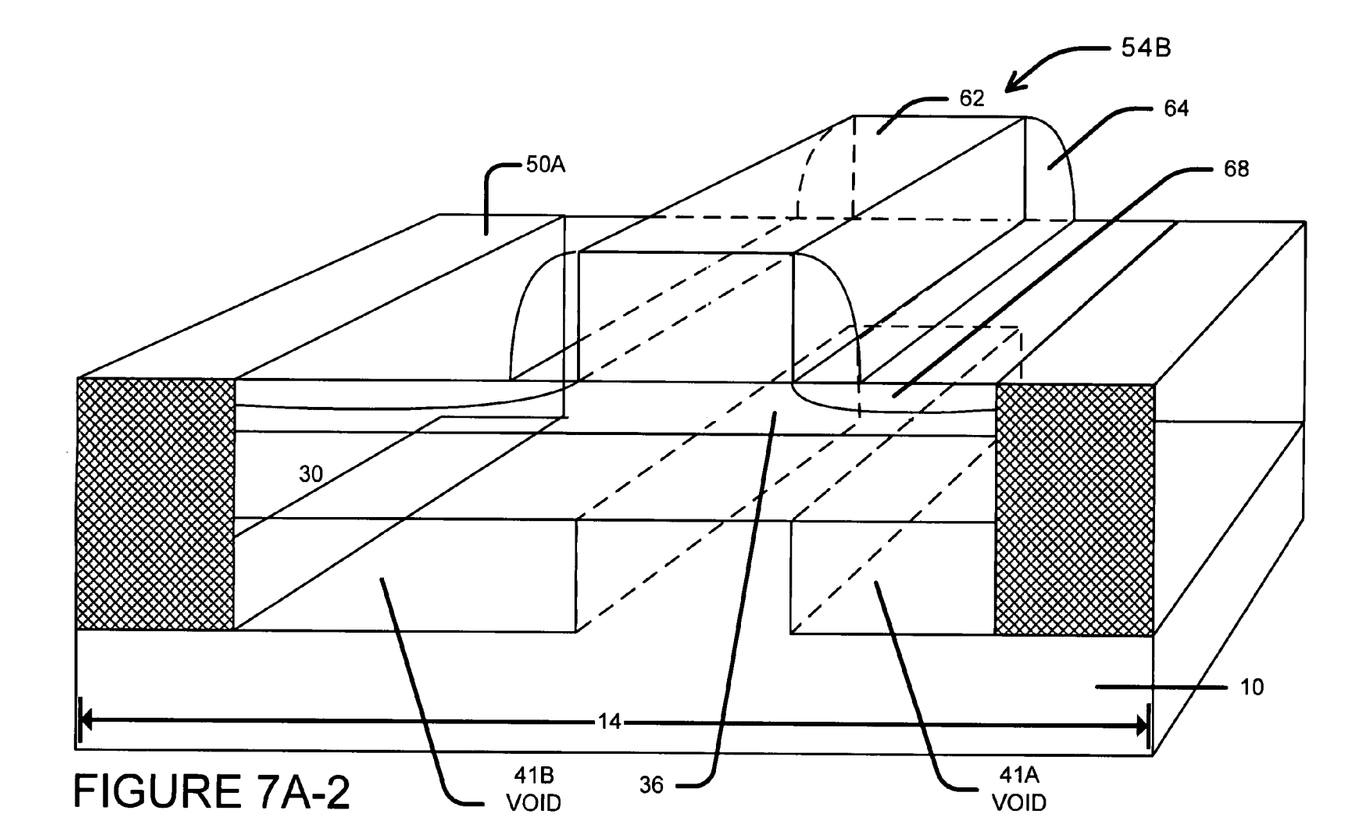

In a second example embodiment shown in FIG. 7A-2, voids 41A 41B are formed under the source and drain regions 68 of a FET 54B.

Figure 7B:
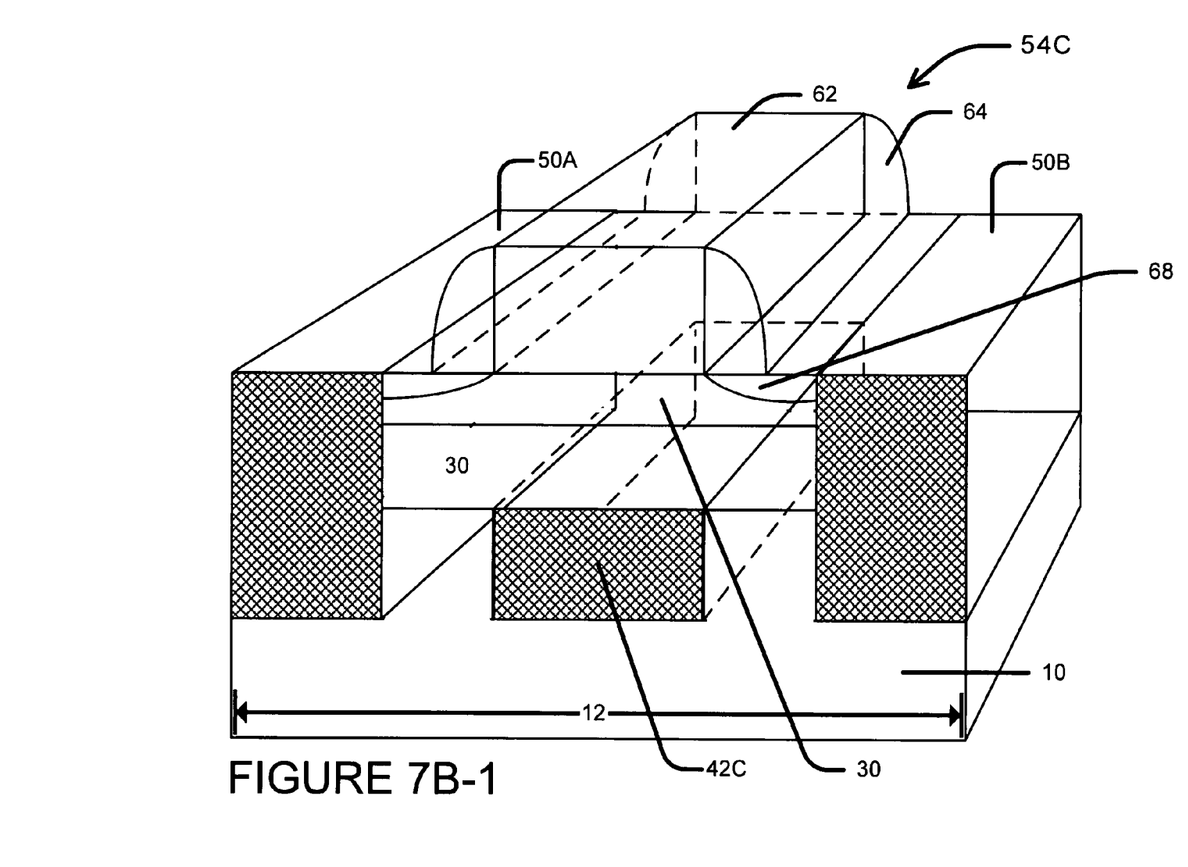

In a third example embodiment shown in FIG. 7B-1, lateral trench isolation regions 42C are formed under the channel of a FET 54C.

Figure 7B:
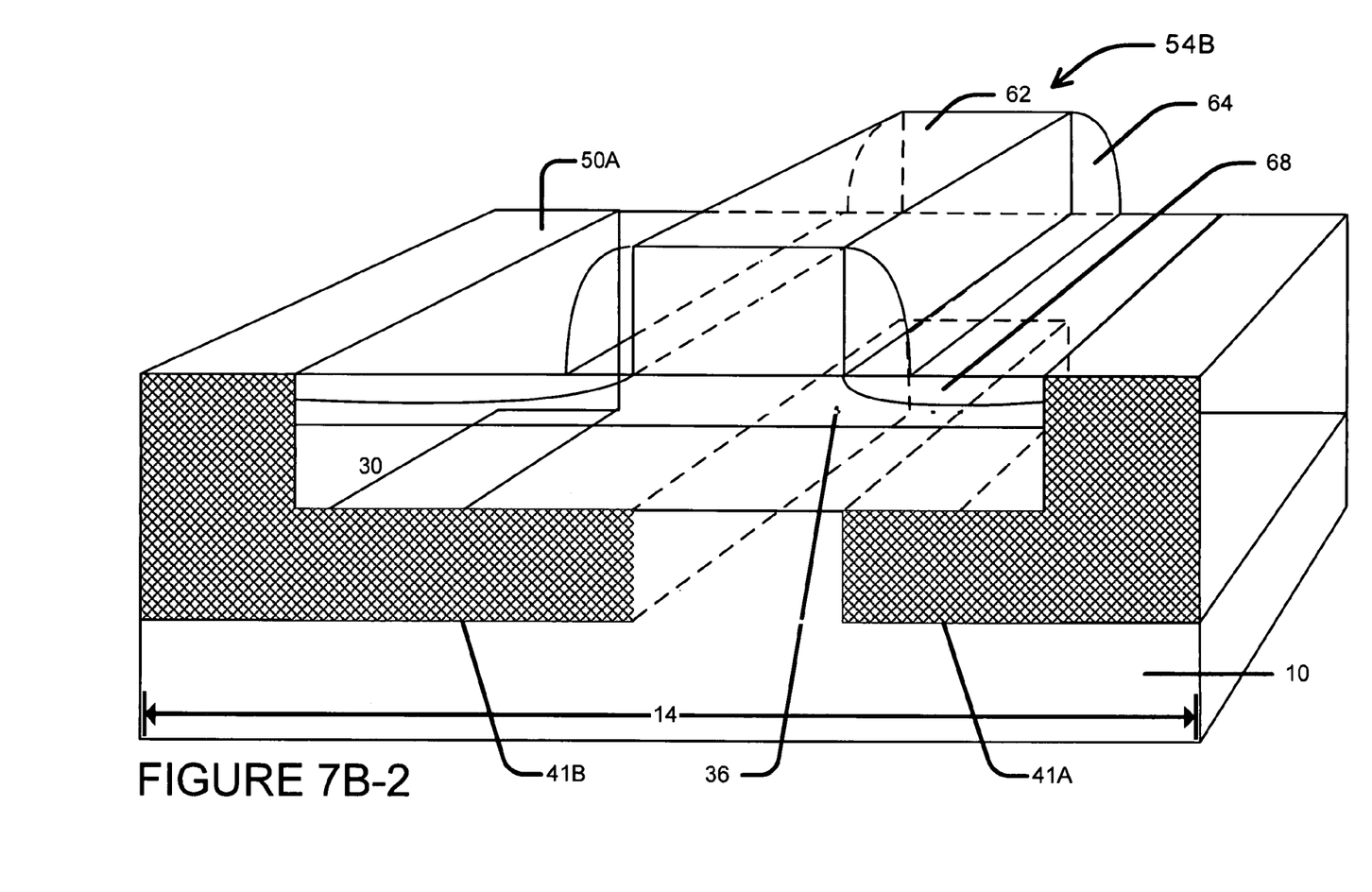

In a fourth example embodiment shown in FIG. 7B-2, lateral trench isolation regions 42A 42B are formed under the source and drain regions 68 of a FET 54D.

Below are descriptions for example method embodiments that can be used make the device embodiments.

I. First and Second Exemplary Method Embodiments with Buried Voids

FIGS. 1, 2, 3, 4, 5A and 6A and FIGS. 7A-1 and 7A-2 show example methods steps. See FIGS. 7A-1 and 7A-2 for 3 dimensional views.

A example method for forming the first and second embodiments is described below.

A. Form One or More Buried Doped Regions in a Substrate

Figure 1:
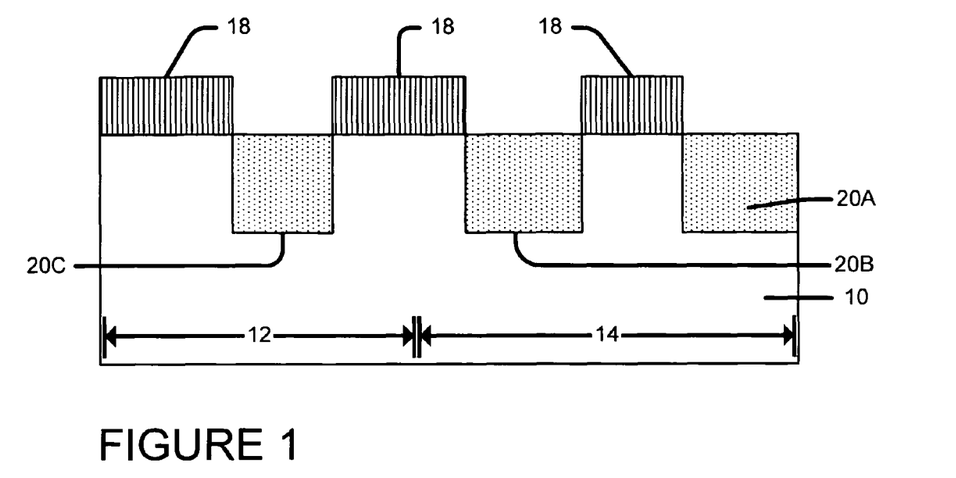
FIGS. 1, 2, 3, and 4 are cross sectional views of steps common to the first, second, third and fourth example method embodiments of the present invention.

Referring to FIG. 1, there is shown a cross section of a portion of an integrated circuit where we form one or more buried doped regions 20A 20B 20C in a substrate 10.

Substrate

The substrate 10 has a first area 12 and a second area 14 where two devices will be formed. The first embodiment device will be shown formed in the first area 12. The second embodiment device will be shown formed in the second area 14. The two devices are shown side by side during processing but the device can be formed separately or with other process steps and devices.

The substrate 10 can be comprised of silicon, such as a bulk crystal silicon wafer. For example the a silicon substrate can be p-doped with a (001) orientation or other orientations such as (110) orientation.

Subsequently Formed FETs

A FET transistor will be formed on the substrate. Other type devices such as bipolar transistors can also be formed.

The FET transistors are comprised of source and drain regions, a gate dielectric and gate. The substrate 10 has source and drain areas over where source and drain regions will be subsequently formed and a channel area over where the gate will be formed. Preferably the transistors are bulk silicon MOSFETs where the FET are usually electrically connected to the substrate. In contrast to bulk silicon MOSFETs, an SOI MOSFET is usually electrically floating in relation to the substrate.

Buried Doped Regions 20A 20B and 20C

The buried doped regions 20A 20B 20C can be formed by implanting a N-type or P-type dopant and annealing the substrate. The buried doped regions can be formed later in the process, such as after the layers 30 36 are formed.

In the first area 12, a channel buried doped region 20C is formed in a channel area that is under a channel region (or gate) of a subsequently formed FET. In the second area 14, source and drain buried doped regions 20A 20B are formed in source and drain areas under source and drain regions of a subsequently formed FET.

The type of the dopant for the buried doped regions doesn't matter, so long as it allows the buried doped region to be etch selectively to the substrate.

Figure 2:
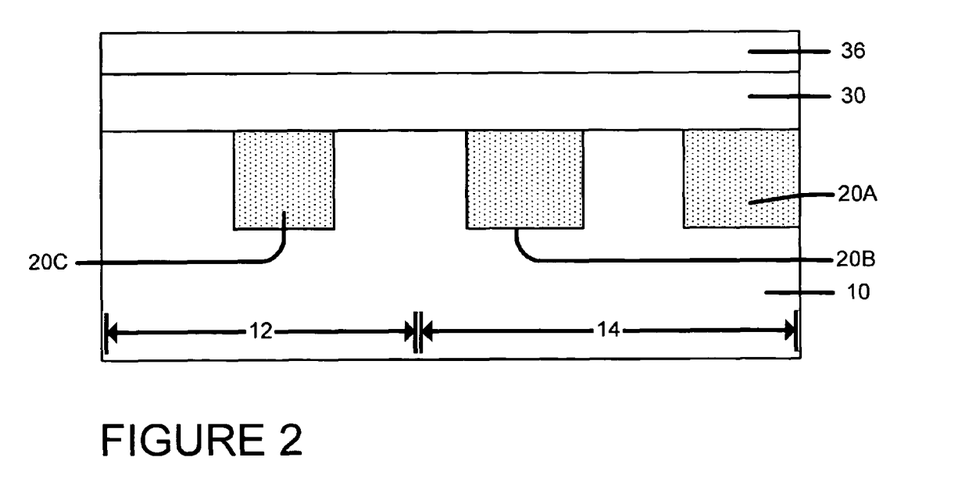

The buried doped layer is preferably implanted to a depth that will enable a sufficient thickness of subsequently formed void to be formed for sufficient electrical insulation or strain. As shown in FIG. 2, the buried doped regions preferably extend from the substrate surface to a given depth.

B. Form a Stressor Layer Over the Substrate

Referring to FIG. 2, we can form a stressor layer 30 over the substrate 10.

The stressor layer 30 is preferably comprised of SiGe (silicon-germanium), or SiGeC. The stressor layer has a crystalline structure so that the subsequently formed strained layer 36 has a strain, preferably has a biaxial strain. The stressor layer 30 can be formed of a SiGe alloy having a Si atomic percent between 50 and 85 and a Ge atomic % between 15 and 50. The stressor layer can have a graded Ge concentration any profile, but a single Ge concentration is the easiest to implement. The stressor layer can be comprised of one or more layers. The stressor layer can have varying Ge concentrations.

The amount of strain and thickness of the stressor layer can be determined by classical thickness theory. Growth conditions, Ge composition and thickness can be defined to ensure that the stressor layer is fully strained without any defects. The growth can be done by LPCVD or other commercially available methods.

C. Form a Strained Layer Over the Stressor Layer

Still referring to FIG. 2, we form a strained layer 36 over the stressor layer 30. The strained layer 36 can be comprised of Si, or carbon doped Si (Si:C). The strained layer can have a thickness between 200 and 2000 angstroms.

The strain in Si or Si:C layer over the stressor layer, only exists after the voids formation. The reason why Si is not strained at the point is that SiGe 30 is fully strained with lattice constant (in-plane) same as Si lattice. However if a void is formed underneath of SiGe 30, relaxation of SiGe occurs and leads to strain in overlying Si 36.

D. Form STI Trenches and Lateral Trenches

Figure 4:
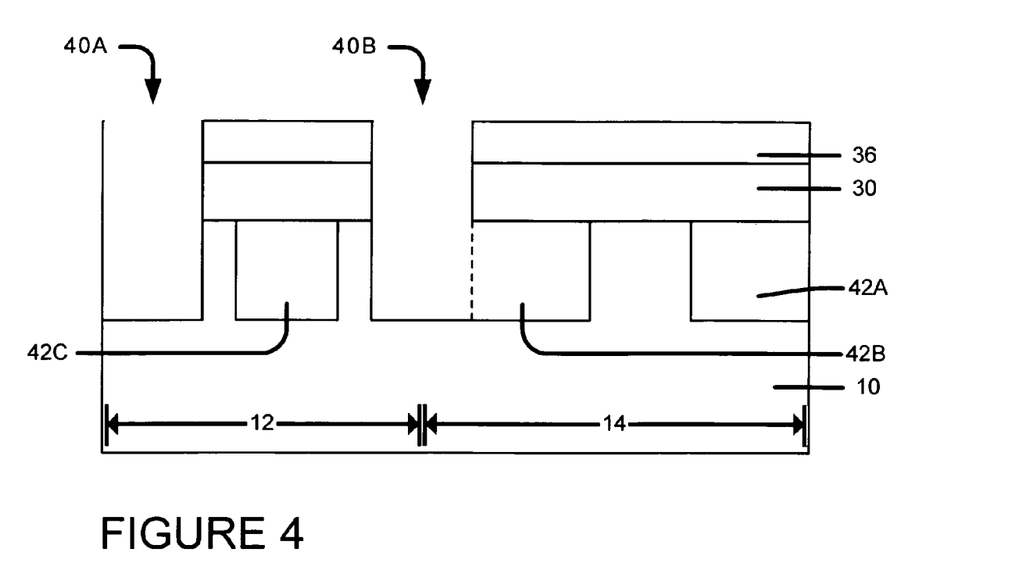

Next, we form STI trenches 40A 40B and lateral trenches 41A 41B 41C as shown in FIG. 4. The trenches can be formed by single etch process, or a multi step etch process and/or an in situ etch process. The lateral trenches are preferably about lateral, but can have any shape as defined by the buried doped layer and implant process. Preferably the top surface of the trenches are about lateral.

Form STI Trenches

Figure 3:
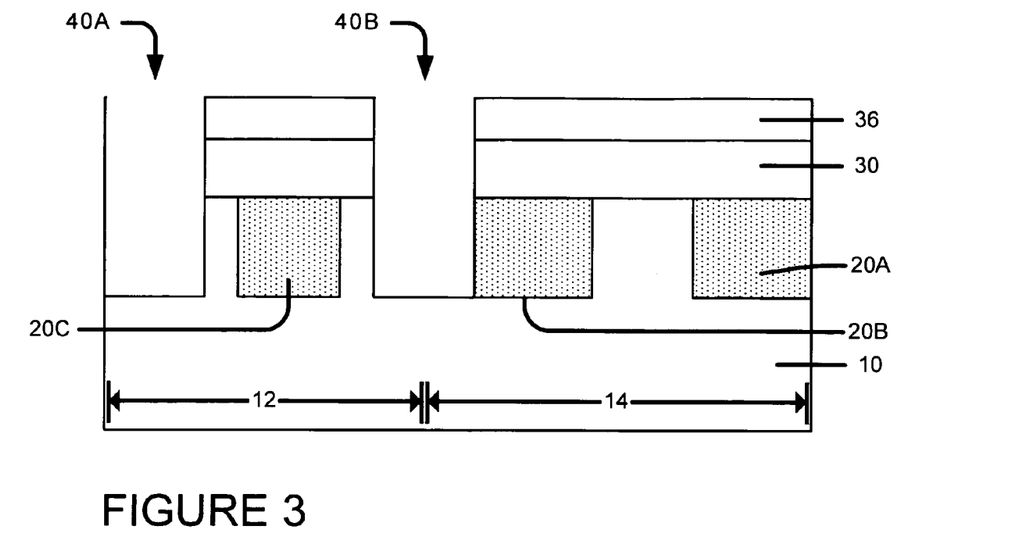

Referring to FIG. 3, we can form shallow trench isolation (STI) trenches (e.g., isolation trenches) 40A 40B by etch down through the strained layer 36 the stressor layer 30 to as least partially expose the substrate 10 and the buried doped regions 20A 20B 20C.

Those skilled in the art are well aware that STI regions are formed around a transistor area, extending both in front of and behind the plane of the drawing. The STI thus defines a set of islands in the silicon substrate in which the transistors will be formed.

Form a Cavities 41A 41B 41C

We etch the buried doped regions 20A 20B 20C to form cavities (e.g., lateral trenches) 41A 41B 41C in communication with the STI trenches 40A 40B.

Preferably the etch is in situ with the STI trench etch. The STI and lateral trench etches can be performed in one step or two or more steps. The etches can use the same etch chemistries. The etch can be done in a single process with slight changes in process conditions, by people skilled in the art.

In the first area 12, the channel cavity (e.g., channel lateral trench) 41C is at least partially under the subsequently formed channel region of the FET. The channel lateral trench 41C preferably substantially under all of the subsequently formed channel region for the FET.

In the second area 14, the source and drain cavities 41A 41B (S/D lateral trench) are at least partially under the subsequently formed source and drain regions of the FET. Preferably, the source and drain lateral trenches 41A 41B are substantially under all the subsequently formed source and drain regions for the FET.

E. Fill Only the STI Trenches with Insulation Material to Form Isolation Regions and Form Voids in the Lateral Trenches Referring to FIG. 5A, we fill the STI trenches 40A 40B with insulation material to form isolation regions (e.g., STI regions) 50A 50B and form voids 41A 41B 41C in the cavities (e.g., lateral trenches). The lateral trenches or voids are not filed with material.

Figure 5A:
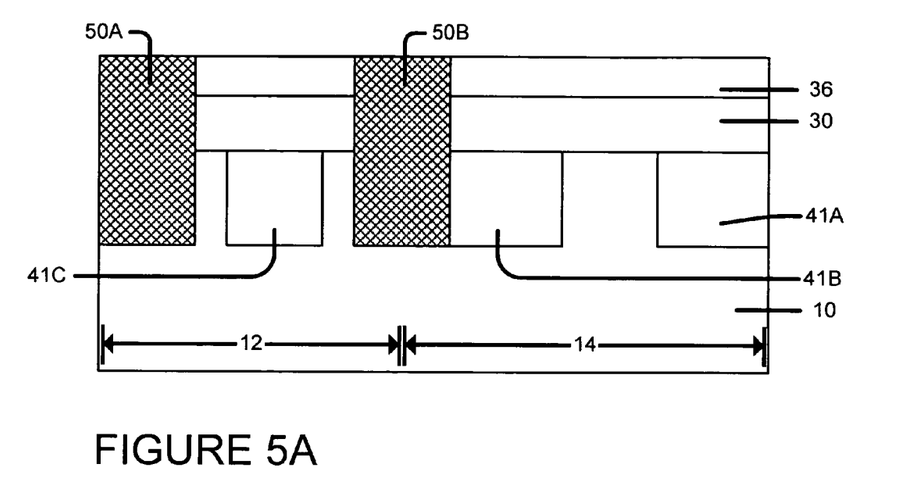
FIGS. 5A and 6A are cross sectional views for illustrating a method for forming isolation regions according to first and second example method embodiments of the present invention.

The isolation regions 50A 50B can be formed by a process that mostly anisotropically fills the trenches. The insulation material can be an silicon oxide.

The voids 41A 41B 41C create a strain in the strain layer 36. The strain can be biaxial and uniaxial, depending on the geometry of the devices. For a wide void, and length direction is the channel, Si channel is uniaxially strained, and can be tensile or compressive, depending on whether SiGe is at S/D or at the channel.

F. Form a Transistor on the Strained Layer

Figure 6A:
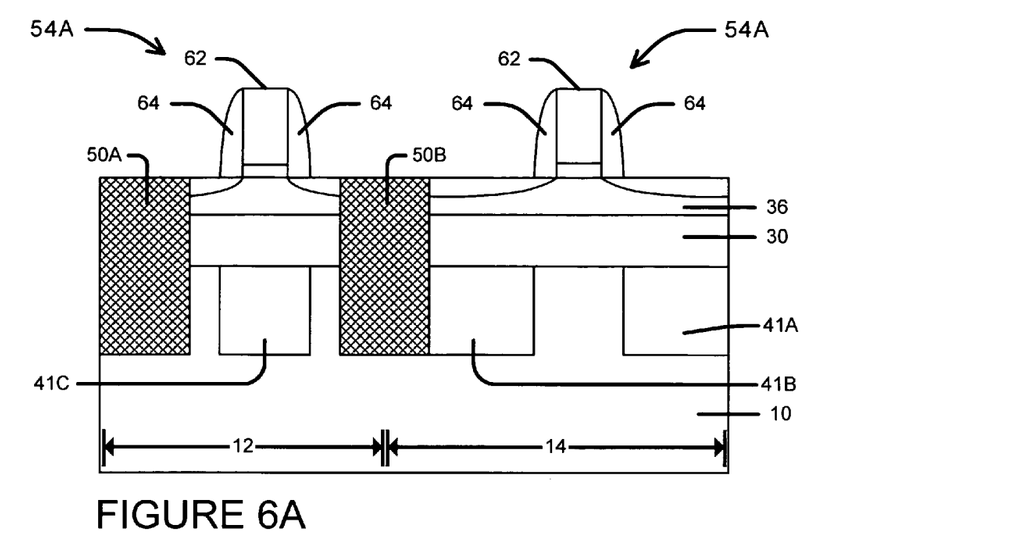

Referring to FIG. 6A, we form an example transistors 54A 54B on the strained layer 36. The transistors can be comprised of source and drain regions 68, sidewall spacers 64, gate dielectric layers 60 and gates 62 over the channel area.

The transistors can be NMOS or PMOS or combinations.

Conventional steps such as blanket threshold adjust implants, well formation, annealing and the like may be performed as is well known in the art, and can be performed any time during the processing. The circuit is completed with additional transistors, conventional back end interconnect, aluminum or copper, to form the desired circuit.

Other type devices can be formed over or in the strained layer with the invention's lateral voids. The other devices such as, BJT, HBT can be potentially integrated with the desirable energy band configuration, brought by the strain.

With the voids 41A 41B under the S/D regions 68, stressor layer/strained layer (e.g, SiGe/Si bilayer) 30 36 becomes free-standing in one or two dimensions, allowing the film stack to re-distribute strain in the system.

For voids 41A 41B under S/D, the Si channel under the gate can be compressively strained (in the directions between source and drain regions), which improves PMOS device performance. It should be compressive from S/D, along the channel length direction. Width no strain, if width is big. Z direction gets tensile because of poisson ratio. Therefore, FET 54B is preferably a PMOS Tx.

With voids 41C under channel region, the Si channel in the strained layer 36 can be tensile strained, which improves NMOS device performance. The stress can be biaxial or uniaxial, but mostly uniaxial, (tensile) for NMOS, Z direction gets compressive. Therefore, FET 54B is preferably a NMOS FET.

II. Third and Fourth Example Embodiments with Buried Cavities Filled with Insulation Material FIG. 6B and FIGS. 7B-1 and 7B-2 show third and fourth example embodiments where the buried cavities 41A 41B are filled with an insulation material.

FIG. 7B-1 shows the example of the third exemplary embodiment where the (channel) buried cavity 41C is filled with insulating material to form a buried (lateral) isolation region 42C under the channel of the subsequently formed FET.

FIG. 7B-2 shows the example of the forth exemplary embodiment where the (source and drain) buried cavities are filled with insulating material to form lateral buried isolation regions 42A 42B under the source and drain regions 68.

Figure 5B:
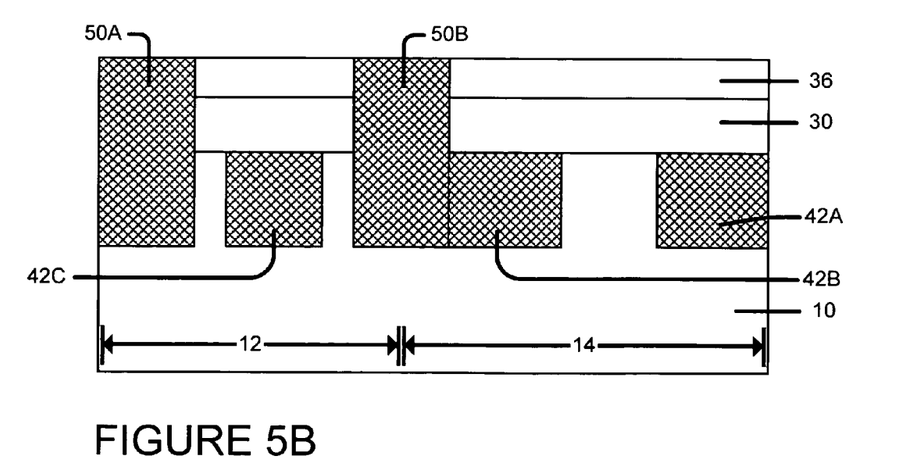
FIGS. 5B and 6B are cross sectional views showing third and fourth example method embodiments where the lateral trenches 41A 41B are filled with an insulation material.
Figure 6B:
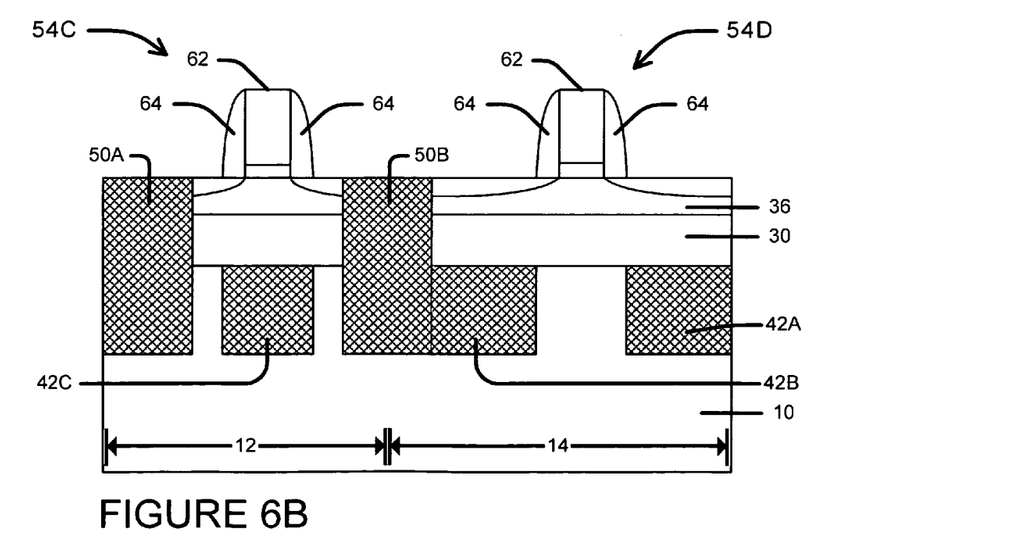

The steps to form the third and fourth embodiments can be the same as described above for FIGS. 1 thru 4. FIGS. 5B and 6B show subsequent steps.

A. Fill the STI Trenches and the Lateral Trenches with Insulation Material to Form Isolations Regions and Lateral Trench Isolations Referring to FIG. 5B, we fill the STI trenches 40A 40B and the lateral trenches 41A 41B 41C with insulation material to form isolations regions 50A 50B and lateral trench isolations regions 42A 42B and 42C.

In the first area 12, the lateral trench isolation region 42C is formed at least partially under the channel region of the subsequently formed transistor.

In the second area 14, the lateral trench isolation regions 42A 42B are preferably formed at least partially under the source/drain regions of the subsequently formed transistor.

B. Form Transistors

Referring FIG. 6B and FIGS. 7B-1 and 7B-2, the transistors 54C 54D and/or other devices can be formed in/on the substrate structure 10 30 36 as discussed above.

Referring to FIG. 6B, we form an example transistors 54C 54D over the substrate structure 10 30 36. The transistors can be comprised of source and drain regions 68, sidewall spacers 64; gate dielectric layers 60 and gates 62 over the channel area. Tx 54C can be NMOS, and Tx 54D can be PMOS For device performance enhancements In FIG. 6B, the transistor 54C can be PMOS and/or NMOS.

In FIG. 6B, the transistor 54D can be PMOS and/or NMOS.

C. Non-Limiting Example Embodiments

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a semiconductor device comprising:
    providing a substrate comprising a first device region;
    forming at least one doped region in the substrate;
    forming a stressor layer over the substrate, the stressor layer comprising a semiconductor stressor material;
    forming a semiconductor surface layer over the stressor layer; and
    selectively removing the at least one doped region to form at least one buried cavity in the first device region, the buried cavity is disposed below the stressor layer, the buried cavity causing the stressor layer to have a relaxed portion overlying the buried cavity;
    forming a first transistor in the first device region; and
    wherein the stressor layer is a continuous stressor layer in the first device region, the relaxed portion of the continuous stressor layer caused by the buried cavity below creates a first strain in the surface layer to enhance performance of the first transistor in the first device region.

2. The method of claim 1 wherein:
    forming at least one doped region comprises forming first and second doped regions;
    removing the first and second doped regions forms first and second buried cavities; and
    wherein the first transistor comprising a gate, and source and drain regions adjacent to the gate,
    wherein the first and second buried cavities are at least partially under the source and drain regions.

3. The method of claim 1 wherein the substrate is comprised of silicon and the doped region is formed by implanting a N-type dopant and annealing the substrate.

4. The method of claim 1 wherein said stressor layer is comprised of SiGe or SiGeC.

5. The method of claim 1 wherein the surface layer is comprised of Si or carbon doped silicon.

6. A method for forming a device comprising:
    providing a substrate comprising a first device region;
    forming a stressor layer over the substrate, the stressor layer comprising a semiconductor stressor material;
    forming a semiconductor surface layer over the stressor layer; and
    forming at least one buried cavity in the first device region under the stressor layer, the buried cavity causing the stressor layer to comprise at least one relaxed portion overlying the buried cavity;
    forming a first transistor in the first device region; and
    wherein the stressor layer is a continuous stressor layer in the first device region the relaxed portion of the continuous stressor layer creates a first strain in the surface layer to enhance performance of the first transistor in the first device region.

7. The method of claim 6 wherein forming at least one buried cavity comprises forming first and second buried cavities below source and drain regions of the first transistor in the first device region.

8. The method of claim 6 wherein the at least one buried cavity is formed below a channel region of the first transistor in the first device region.

9. The method of claim 6 wherein forming the buried cavity comprises:
    forming a doped region within the substrate in a defined portion of the first device region; and
    forming a shallow trench isolation to isolate the first device region.

10. The method of claim 9 wherein forming the shallow trench isolation comprises:
    etching the substrate to form a trench for the shallow trench isolation, wherein etching removes portion of the substrate corresponding to the doped region; and
    filling the trench to form the shallow trench isolation and the buried cavity in the removed doped portion of the substrate.

11. The method of claim 6 wherein the strained portion of the stressor layer has about a same lattice constant as the surface layer.

12. The method of claim 11 wherein the relaxed portion of the stressor layer has a larger lattice constant than the surface layer.

13. The method of claim 12 wherein the relaxed portion of the stressor layer is formed below a channel region of the first transistor in the first device region and the first strain is a tensile stress generated in the channel region.

14. The method of claim 12 wherein the relaxed portion of the stressor layer is formed below a source and drain region of the first transistor in the first device region and the first strain is a compressive stress generated in a channel region of the first transistor.

15. The method of claim 6 wherein the relaxed portion of the stressor layer is formed below a channel region of the first transistor in the first device region and the first strain is a tensile stress generated in the channel region.

16. The method of claim 6 wherein the relaxed portion of the stressor layer is formed below a source and drain region of the first transistor in the first device region and the first strain is a compressive stress generated in a channel region of the first transistor.

17. The method of claim 6 wherein forming the buried cavity comprises:

forming a doped region within the substrate in a defined portion of the first device region and selectively removing the doped region.

18. The method of claim 17 comprising forming the doped region before forming the stressor layer and semiconductor surface layer.

19. The method of claim 17 comprising selectively removing the doped region after forming the stressor layer and semiconductor surface layer.

20. The method of claim 6 wherein the at least one buried cavity is filled with insulation material.

21. The method of claim 6 further comprising forming a first gate stack over the surface layer after forming the at least one buried cavity wherein the first gate stack is associated with the first transistor.

* * * * *